United States Patent
Lin et al.

(10) Patent No.: US 6,174,791 B1
(45) Date of Patent: Jan. 16, 2001

(54) METHOD FOR A PRE-AMORPHIZATION

(75) Inventors: Tony Lin, Kaohsiung Hsien; Jih-Wen Chou; C. C. Hsue, both of Hsinchu, all of (TW)

(73) Assignee: United Microelectronics Corp., Hsinchu (TW)

( * ) Notice: Under 35 U.S.C. 154(b), the term of this patent shall be extended for 0 days.

(21) Appl. No.: 09/276,294

(22) Filed: Mar. 25, 1999

(51) Int. Cl.$^7$ .................................... H01L 21/425
(52) U.S. Cl. ..................... 438/528; 438/586; 438/199
(58) Field of Search ................... 438/586, 585, 438/528, 199, 291, 275, FOR 206, 208

(56) References Cited

U.S. PATENT DOCUMENTS 5,888,888 * 3/1999 Talwar et al. .

OTHER PUBLICATIONS

Yu et al., CMOS Transistor Reliability and Performance Impacted by Gate Microstructure, pp. 35–41, (IEEE), 1997.*

* cited by examiner

*Primary Examiner*—Charles Bowers
*Assistant Examiner*—Scott J. Hawranek
(74) *Attorney, Agent, or Firm*—Hickman Coleman & Hughes, LLP

(57) ABSTRACT

A method for forming an amorphous silicon layer over the terminals of a MOS transistor. The method includes the steps of forming a mask layer having an opening that exposes the gate polysilicon layer over the MOS transistor. Next, using the mask layer as a mask, an inactive ion implant operation is carried out such that inactive ions are implanted into the gate polysilicon layer. Thereafter, again using the mask layer as a mask, a first heavy bombarding operation is carried out, implanting ions locally. Finally, the mask layer is removed and then a second heavy bombarding operation is carried out, implanting ions globally.

20 Claims, 3 Drawing Sheets

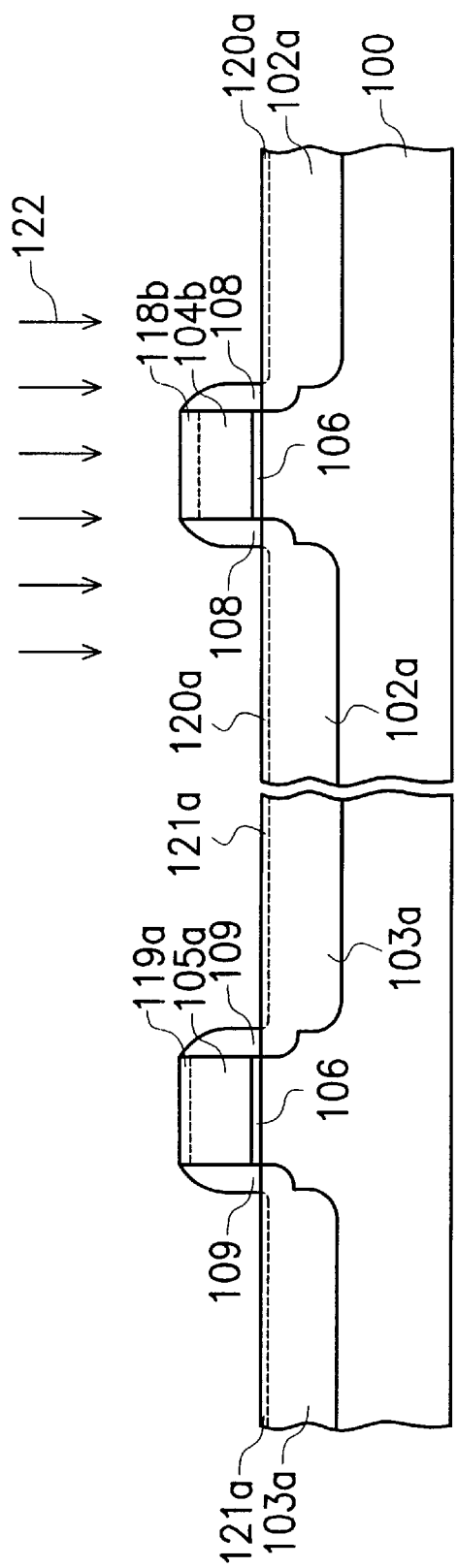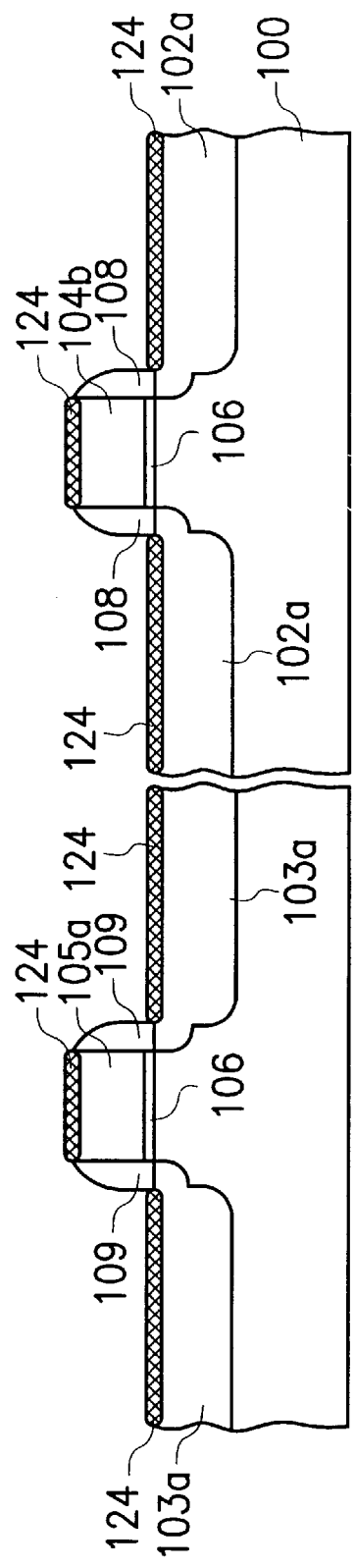

METHOD FOR A PRE-AMORPHIZATION

BACKGROUND OF THE INVENTION

1. Field of Invention

The present invention relates to a method for a pre-amorphization. More particularly, the present invention relates to a method for creating an amorphous layer over the gate and the source/drain regions of a MOS transistor before performing a self-aligned titanium silicide process (Salicide process).

2. Description of Related Art

As the dimensions of polysilicon gate continue to shrink, narrow line effect becomes a major factor in producing high-quality, self-aligned titanium silicide layers. The so-called narrow line effect refers to problems due to a reduction in gate dimensions. With a small gate dimensions, too much stress may accumulate at the interface between the polysilicon gate and the metal silicide layer. In addition, there may be too few nucleation sites on the original surface for forming a high quality metal silicide layer, thereby leading to an increase in sheet resistant that may frequently affect the operation of the transistor gate.

Therefore, in the fabrication of semiconductor devices having a line width smaller than 0.25 μm, a pre-amorphization implant (PAI) is normally carried out first. The PAI creates a layer of amorphous silicon over the polysilicon gate and the source/drain regions of a transistor so that a subsequent self-aligned silicide process can produce a metal silicide layer having a lower sheet resistant.

The most common pre-amorphization method includes bombarding the surface of a polysilicon layer with arsenic (As$^+$) ions. The arsenic ions damage the internal crystal structure of the polysilicon layer so that a layer of amorphous silicon is formed. However, after a PAI treatment with arsenic ions, some of the ions may pass through the grain boundaries of the polysilicon crystal and finally end up at the interface between the polysilicon gate or the gate oxide layer itself. In some cases, the arsenic ions may even penetrate into the substrate leading to an increase in subthreshold current of an NMOS and the amplification of the kink effect.

In addition, if the transistor is a PMOS, P-type dopants are embedded inside its source/drain regions. Therefore, whenever a pre-amorphization treatment is performed with N-type arsenic ions, some of the N-type arsenic ions implanted into the source/drain regions may neutralize the effect produced by the original P-type dopants. Consequently, conductivity at the source/drain regions of a PMOS may worsen and the current (Id) flowing from the source/drain terminal may drop.

In light of the foregoing, there is a need to provide a better pre-amorphization method.

SUMMARY OF THE INVENTION

Accordingly, the purpose of the present invention is to provide a method for a pre-amorphization capable of preventing arsenic ions from penetrating through the gate polysilicon layer into the gate oxide layer, and hence reducing abnormal subthreshold current of an NMOS and kink effect.

In another aspect, the purpose of the present invention is to provide a method for a pre-amorphization capable of preventing a drop in current flowing from source/drain terminals due to performing a pre-amorphizing implant with respect to a PMOS transistor using arsenic ions.

To achieve these and other advantages and in accordance with the purpose of the invention, as embodied and broadly described herein, the invention provides a method for a pre-amorphization. The method includes the steps of forming a patterned mask layer over a substrate having PMOS transistors and NMOS transistors. The patterned mask layer has an opening that exposes the gate polysilicon layer of the NMOS transistors. Next, an inactive ion implant is carried out, implanting inactive ions into the gate polysilicon layer of the NMOS transistors using the patterned mask layer as a mask. Thereafter, a first heavy bombardment of the gate polysilicon layer with ions is carried out, again using the patterned mask layer as a mask. After that, the patterned mask layer is removed. Finally, a second heavy bombardment of the gate polysilicon layer and the source/drain regions with ions is carried out.

In the inactive ion implant, inactive ions such as nitrogen ions ($N_2^+$) are implanted into the gate polysilicon layer at an energy level of between 10 KeV and 30 KeV and a dosage of between IE13 and IE15 atoms/cm$^2$.

In the first heavy bombardment of the gate polysilicon layer to form an amorphous layer, arsenic ions (As$^+$), for example, are implanted at an energy level of between 20 KeV and 40 KeV and a dosage of between IE14 and IE15 atoms/cm$^2$.

In the second heavy bombardment of the gate polysilicon layer and the source/drain regions to form an amorphous layer, ions such as arsenic ions (As$^+$) are implanted at an energy level of between 20 KeV and 40 KeV and a dosage of between IE13 and IE14 atoms/cm$^2$.

Because inactive ions are first implanted into the gate polysilicon layer first, it is very difficult for arsenic ions to penetrate through the gate polysilicon layer into the gate oxide layer during the first and the second ion implant.

According to one preferred embodiment of this invention, an amorphous layer having a thickness of between 50 Å and 100 Å is formed on the surface of the gate polysilicon layer after the first heavy bombardment with ions. The nitrogen ions implanted in the inactive ion implant operation are capable of blocking the arsenic ions from passing through the polysilicon layer into the gate oxide layer. During the second heavy bombardment, the amorphous layer on the gate polysilicon layer thickens to between 200 Å and 500 Å. Because a thin amorphous layer already exists before the second heavy bombardment, ions implanted into the gate polysilicon layer in the second implant cannot penetrate through the interface between the gate polysilicon layer and the gate oxide layer interface. Since none of the ions is able to get to the substrate, subthreshold current does not increase. Therefore, subthreshold kink effect can be avoided.

Furthermore, the source/drain regions are covered by a mask layer during the first heavy bombarding operation. Since ions are added to the source/drain regions only in the second bombarding operation, concentration of the implanted ions is only moderate. Hence, the conductivity at the source/drain region decreases just a little and the current (Id) flowing from the source/drain terminals does not drop too much.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings, FIGS. 1A through 1E are cross-sectional views showing a pre-amorphization treatment and subsequent performance of a self-aligned silicide process with respect to a MOS transistor according to one preferred embodiment of this invention.

DESCRIPTION OF THE PREFERRED EMBODIMENTS

Figure 1A:
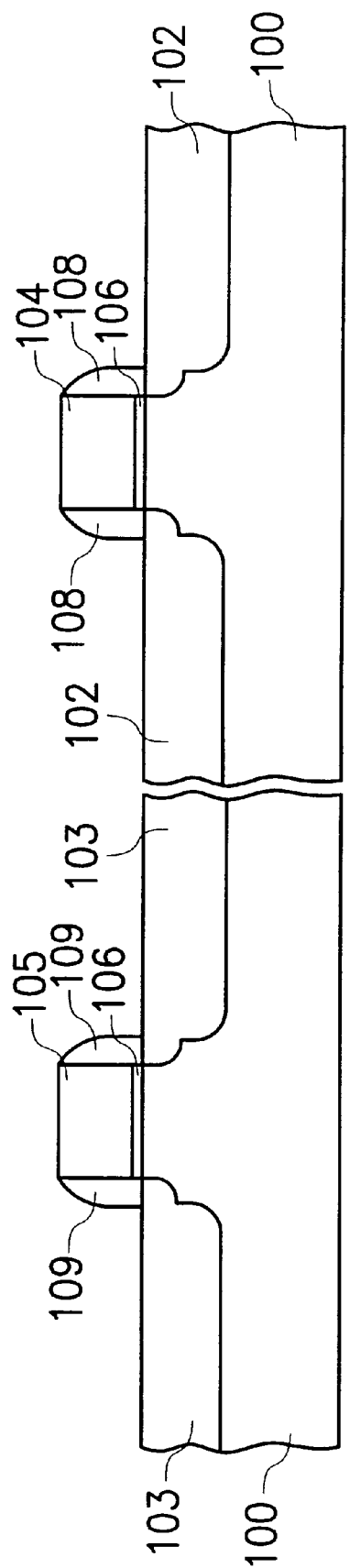

Reference will now be made in detail to the present preferred embodiments of the invention, examples of which are illustrated in the accompanying drawings. Wherever possible, the same reference numbers are used in the drawings and the description to refer to the same or like parts.

FIGS. 1A through 1E are cross-sectional views showing a pre-amorphization treatment and subsequent performance of a self-aligned silicide process with respect to a MOS transistor according to one preferred embodiment of this invention.

A substrate 100 at least having an N-type MOS transistor 101 and a P-type MOS transistor 101a formed thereon is provided as shown in FIG. 1A. The N-type MOS includes a polysilicon layer 104, a gate oxide layer 106 and source/drain regions 102. The source/drain regions 102 contain N-type dopants. The P-type MOS includes a polysilicon layer 105, a gate oxide layer 107 and source/drain regions 103. The source/drain regions 103 contain P-type dopants. Spacers 108 are formed on the sidewalls of the polysilicon layer 104. Spacers 109 are formed on the sidewalls of the polysilicon layer 105. The spacers 108 and 109 can be a silicon oxide layer or a silicon nitride layer, for example. In this embodiment, although the source/drain regions 102 are shown to have a lightly doped source/drain structure, other types of structures are equally applicable, as well.

Figure 1B:
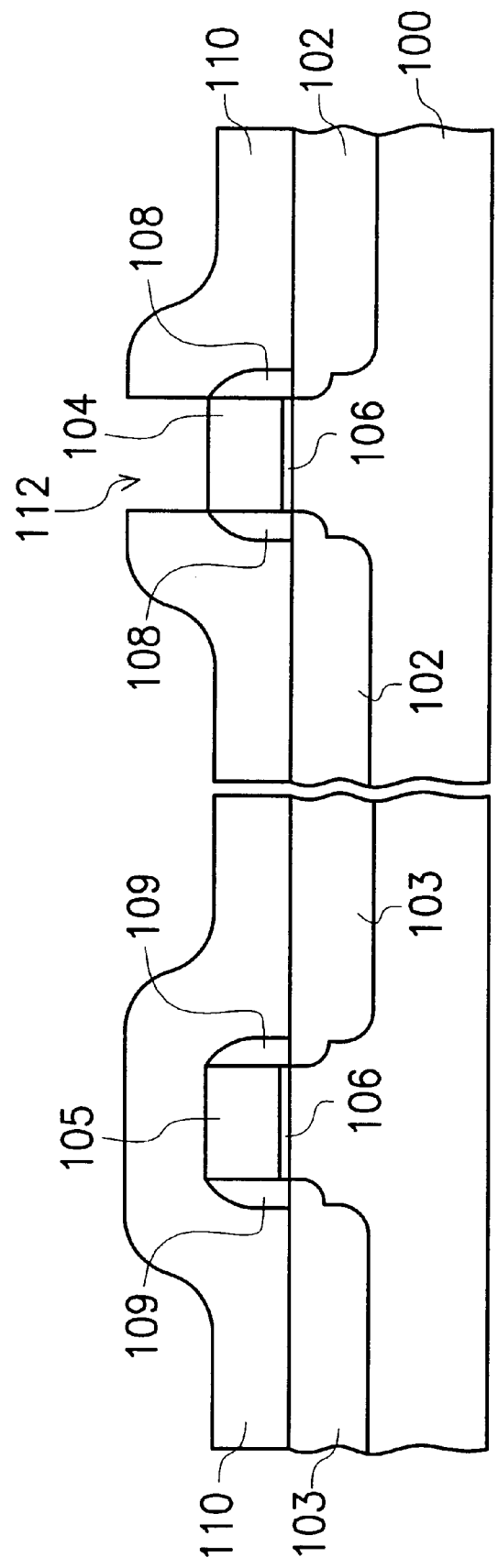

As shown in FIG. 1B, a patterned mask layer 110 is formed over the entire substrate 100. The patterned mask layer 110 has an opening 112 that exposes the polysilicon layer 104. The mask layer 110 can be a photoresist layer or a silicon nitride layer formed using, for example, conventional photolithographic and etching processes. The same mask is used for carrying out the light exposure in the photolithographic process as in patterning the polysilicon layer 104.

Figure 1C:
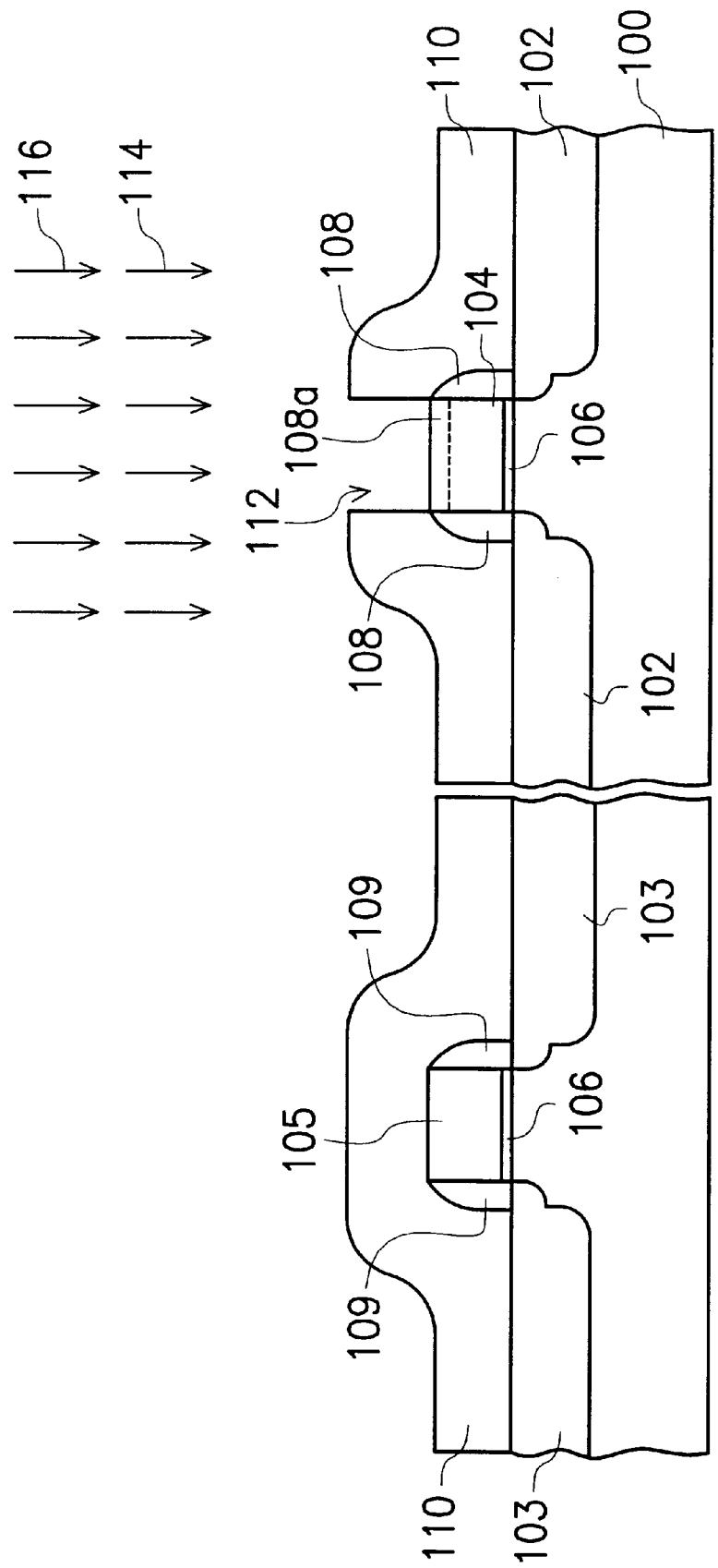

As shown in FIG. 1C, an inactive ion implant is carried out, implanting special inactive ions 114 into the polysilicon layer 104 with the mask layer 110 serving as a mask. For example, nitrogen ions 114 are implanted into the polysilicon layer 104 at an energy level of between 10 KeV and 30 KeV and a dosage level of between IE13 and IE15 atoms/cm$^2$. Thereafter, a first heavy bombardment of the polysilicon layer 104 is carried out again using the mask layer 110 as a mask. For example, arsenic ions 116 are implanted into the polysilicon layer 104 at an energy level of between 20 KeV and 40 KeV and a dosage level of between IE14 and IE15 atoms/cm$^2$. After the first heavy bombardment by arsenic ions 116, a portion of the original polysilicon layer 104 is transformed into an amorphous silicon layer 118a. The remaining portion now becomes a polysilicon layer 104a. The amorphous silicon layer 118a has a thickness roughly between 50 Å and 100 Å.

In the first heavy bombarding operation, since the polysilicon layer 104 already contains implanted nitrogen ions 114, it is very difficult for the arsenic ions 116 to tunnel through the interface between the polysilicon layer 104a and the gate oxide layer 106. Therefore, no arsenic ions 116 are able to tunnel through the intervening layers into the substrate 100. Consequently, an increase in subthreshold current and subthreshold kink effect can be avoided. However, the PMOS 101a is covered by the mask layer 110 so that the inactive ion implant and the first heavy bombarding operation do not affect the PMOS 101a.

As shown in FIG. ID, the mask layer 110 is removed. In the subsequent step, a second heavy bombardment of the amorphous silicon layer 118a, the polysilicon layer 104a and the source/drain regions 102 is carried out. For example, arsenic ions 122 are implanted at an energy level of between 20 KeV and 40 KeV and a dosage level of between IE13 and IE14 atoms/cm$^2$. After the second heavy bombarding operation, the first amorphous layer 118a and a portion of the polysilicon layer 104a are transformed into an amorphous silicon layer 118b. The polysilicon layer 104a now becomes a polysilicon layer 104b. In addition, the top portion of the each source/drain region 102 becomes an amorphous silicon layer 120a and a source/drain region 102a. The amorphous silicon layer 118b has a thickness of between 200 Å and 500 Å; and the amorphous silicon layer 102a has a thickness of between 50 Å and 100 Å. Since the mask layer 110 is removed, the second heavy bombarding operation makes the polysilicon layer 105 transformed into an amorphous silicon layer 119a. The polysilicon layer 105 now becomes a polysilicon layer 105a. Each of the source/drain regions 103 of the PMOS become an amorphous silicon layer 121a and a source/drain region 103a. The amorphous silicon layer 121a has a thickness of between 50 Å and 100 Å.

In the second heavy bombarding operation, it is very difficult for the arsenic ions 122 to penetrate deep enough to reach the interface between the polysilicon layer 104a and the gate oxide layer 106 due to the presence of an amorphous layer 118a. Since very few arsenic ions 122 are able to tunnel through the intervening layers into the substrate 100, an increase in subthreshold current and subthreshold kink effect can be avoided.

Because arsenic ions are implanted into the source/drain regions 103 only once, the total amount of arsenic ions within the source/drain regions 103 is considerably less than the amount of arsenic ions within the polysilicon gate 104. Hence, the arsenic ions implanted into the source/drain regions 103 hardly affect the P-type dopants originally inside these regions. Consequently, conductivity in each source/drain region 103 only decreases a little and the current (Id) flowing from each source/drain region 103 does not drop too much.

As shown in FIG. 1E, a self-aligned silicide process is carried out to form a metal silicide layer 124 over the amorphous silicon layers 120a, 121a and the amorphous silicon layers 118b, 119a. The self-aligned silicide process includes sputtering a metallic layer (not shown in FIG. 1E) such as titanium over the amorphous silicon layers 120a and 118b. A rapid thermal process is executed so that the metal can react with the amorphous silicon on the layers 120a, 121a, 118b and 119a to form the metal silicide layer 124. Finally, the unreacted or residual metal is removed using a wet etching operation.

In this embodiment, although a structure comprising a PMOS transistor and an NMOS transistor is used as an example, the method can be applied in the preamorphization of a structiure only comprising PMOS transistors or NMOS transistors. In fact, the method can be equally applied to a dual gate integrated circuit design.

In summary, major aspects of this invention includes:

1. By implanting inactive ions into the polysilicon layer of a gate structure first, it is very difficult for subsequent first and second heavy bombardments with arsenic ions to penetrate through the interface between the polysilicon layer and the gate oxide layer.

2. When the nitrogen ions and the arsenic ions in the first heavy bombarding operation are implanted into the polysilicon layer, the source/drain regions are shielded by a mask layer. Therefore, the source/drain regions are bombarded by arsenic ions only once. Hence, relatively few arsenic ions end up in the source/drain regions, and so a drop in source/drain current for a PMOS transistor is very small.

3. By forming a thin amorphous silicon layer over the polysilicon gate layer of the NMOS in a first heavy bombarding operation before carrying out a second ion bombarding operation, an amorphous silicon layer of the desired thickness can be formed.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method for a pre-amorphization applying on a substrate, which at least comprises an NMOS transistor having a first polysilicon gate and first source/drain regions and a PMOS transistor having a second polysilicon gate and second source/drain regions, wherein the method comprising the steps of:

forming a patterned mask layer over the NMOS transistor and the PMOS transistor, wherein the mask layer has an opening that exposes the first polysilicon gate of the NMOS transistor;

performing an inactive ion implant using the mask layer as a mask;

performing a first heavy bombarding operation with ions;

removing the mask layer; and performing a second heavy bombarding operation with ions.

2. The method of claim 1, wherein the step of performing the inactive ion implant includes using an implant method.

3. The method of claim 2, wherein the step of performing the inactive ion implant includes implanting nitrogen ions at an energy level of between 10 KeV and 30 KeV and a dosage level of between IE13 and IE15 atoms/cm$^2$.

4. The method of claim 1, wherein the step of performing the first heavy bombarding operation includes implanting arsenic ions at an energy level of between 20 KeV and 40 KeV and a dosage level of between IE14 and IE15 atoms/cm$^2$.

5. The method of claim 4, wherein after the first heavy bombarding operation with ions, a first amorphous silicon layer having a thickness of between 50 Å and 100 Å is formed on the surface of the first polysilicon gate.

6. The method of claim 4, wherein the step of performing the second heavy bombarding operation includes implanting arsenic ions at an energy level of between 20 KeV and 40 KeV and a dosage level of between IE13 and IE14 atoms/cm$^2$.

7. The method of claim 6, wherein after the second heavy bombarding operation with ions, the first amorphous silicon layer on the first polysilicon gate increases in thickness to between 200 Å and 500 Å.

8. The method of claim 6, wherein after the second heavy bombarding operation with ions, a second amorphous silicon layer having a thickness of between 50 Å and 100 Å is formed on the second polysilicon gate, the first source/drain regions and the second source/drain regions.

9. The method of claim 1, wherein the step of forming the mask layer includes depositing photoresist.

10. The method of claim 1, wherein the step of forming the mask layer includes depositing silicon nitride.

11. A pre-amorphization operation carried out before a self-aligned silicide process, comprising the steps of:

providing a substrate that has a MOS transistor already formed thereon, wherein the MOS transistor includes a gate polysilicon layer and a source/drain region;

performing an inactive ion implantation, implanting inactive ions into the gate polysilicon layer;

performing a first heavy bombarding operation with ions to form a first amorphous silicon layer on a surface of the gate polysilicon layer;

performing a second heavy bombarding operation with ions to increase a thickness of the first amorphous silicon layer and also to form a second amorphous silicon layer on a surface of the source/drain region; and carrying out the self-aligned silicide process.

12. The method of claim 11, wherein before the step of performing an inactive ion implant, further includes forming a patterned mask layer having an opening that exposes the gate polysilicon layer over the MOS transistor such that the inactive ion implant and the first heavy bombarding operation are carried out with the mask layer.

13. The method of claim 12, wherein after the step of performing the first heavy bombarding operation but before the second heavy bombarding operation, further includes removing the mask layer.

14. The method of claim 12, wherein the step of forming the mask layer includes depositing photoresist or silicon nitride.

15. The method of claim 11, wherein the step of performing the inactive ion implantation includes implanting nitrogen ions at an energy level of between 10 KeV and 30 KeV and a dosage level of between IE13 and IE15 atoms/cm$^2$.

16. The method of claim 11, wherein the step of performing the first heavy bombarding operation includes implanting arsenic ions at an energy level of between 20 KeV and 40 KeV and a dosage level of between IE14 and IE15 atoms/cm$^2$.

17. The method of claim 16, wherein after the first heavy bombarding operation with ions, a first amorphous silicon layer having a thickness of between 50 Å and 100 Å is formed on the surface of the gate polysilicon layer.

18. The method of claim 11, wherein the step of performing the second heavy bombarding operation includes implanting arsenic ions at an energy level of between 20 KeV and 40 KeV and a dosage level of between IE13 and IE14 atoms/cm$^2$.

19. The method of claim 18, wherein after the second heavy bombarding operation with ions, the first amorphous silicon layer on the gate polysilicon layer increases in thickness to between 200 Å and 500 Å.

20. The method of claim 18, wherein the second amorphous silicon layer has a thickness of between 50 Å and 100 Å.

* * * * *